US010302685B2

United States Patent
Luo et al.

(10) Patent No.: US 10,302,685 B2
(45) Date of Patent: May 28, 2019

(54) MEASUREMENT SYSTEM

(71) Applicant: GENERAL TEST SYSTEMS INC., Shenzhen (CN)

(72) Inventors: Qingchun Luo, Shenzhen (CN); Penghui Shen, Shenzhen (CN); Wei Yu, Shenzhen (CN)

(73) Assignee: GENERAL TEST SYSTEMS INC., Shenzhen (CN)

(*) Notice: Subject to any disclaimer, the term of this patent is extended or adjusted under 35 U.S.C. 154(b) by 6 days.

(21) Appl. No.: 15/842,758

(22) Filed: Dec. 14, 2017

(65) Prior Publication Data

US 2018/0172746 A1 Jun. 21, 2018

(30) Foreign Application Priority Data

Dec. 20, 2016 (CN) .......................... 2016 1 1184863

(51) Int. Cl.
*G01R 29/08* (2006.01)
*H04B 17/15* (2015.01)
*H04B 17/29* (2015.01)

(52) U.S. Cl.
CPC ......... *G01R 29/0821* (2013.01); *H04B 17/15* (2015.01); *H04B 17/29* (2015.01)

(58) Field of Classification Search
CPC ..... G01R 29/0821; H04B 17/29; H04B 17/15
See application file for complete search history.

(56) References Cited

U.S. PATENT DOCUMENTS

| 4,968,983 | A | * | 11/1990 | Maeda | ............... | G01R 29/0878 342/360 |
| 6,255,830 | B1 | * | 7/2001 | Rollin | ................ | G01R 29/0835 174/387 |
| 2001/0052779 | A1 | * | 12/2001 | Okazaki | ............. | G01R 29/0814 324/637 |
| 2010/0171650 | A1 | * | 7/2010 | Okano | ..................... | H04B 7/04 342/173 |

(Continued)

*Primary Examiner* — Lewis G West
(74) *Attorney, Agent, or Firm* — Hodgson Russ LLP

(57) ABSTRACT

A measurement system including an anechoic chamber, a turntable, N measurement antennas, in which N is a natural number and N≥11, in which a spherical coordinate system is established by taking a center of a measured piece as an origin and a coordinates of the i (i=1, 2, 3, . . . , N) measurement antenna is $A_i(\rho_i, \theta_i, \varphi_i)$, (i=1, 2, 3, . . . , N), in which $\theta_i$ is a positive integral multiple of 15°, and at least one measurement antenna is arranged at a position where the angle θ is 15°, 30°, 30°, 45°, 60°, 75°, 90°, 105°, 120°, 135°, 150° or 165° correspondingly; and 0≤$\varphi_i$≤360°, and the N measurement antennas are not located in the same plane. The present disclosure can create a measurement environment with small coupling interference and low reflection between the measurement antennas in a relatively small anechoic chamber, improving the measurement accuracy.

18 Claims, 12 Drawing Sheets

(56) References Cited

U.S. PATENT DOCUMENTS

| | | | | |
|---|---|---|---|---|
| 2011/0084887 A1* | 4/2011 | Mow | ............ | G01R 29/10 |
| | | | | 343/703 |
| 2011/0299570 A1* | 12/2011 | Reed | ............ | H04B 7/0434 |
| | | | | 375/130 |
| 2012/0225624 A1* | 9/2012 | Kyosti | ............ | H01Q 3/2605 |
| | | | | 455/67.11 |
| 2015/0099473 A1* | 4/2015 | Szini | ............ | H04W 24/06 |
| | | | | 455/67.12 |

* cited by examiner

MEASUREMENT SYSTEM

CROSS-REFERENCE TO RELATED APPLICATION

This application claims priority to and benefits of Chinese Patent Application No. 201611184863.4, filed with State Intellectual Property Office on Dec. 20, 2016, the entire content of which is incorporated herein by reference.

FIELD

The present disclosure relates to a field of communication, and more particularly to a system for measurement of wireless performance parameters.

BACKGROUND

According to standards from the Cellular Telecommunications and Internet Association (CTIA) which is an international standard organization, it is a requirement for measurement of wireless performances of an antenna and a wireless device that, after a measured piece is measured at different spatial positions on a spherical surface whose center is the measured piece, a corresponding index is obtained by an integrative calculation of all the measured results. A wireless terminal can register and access the network only when its measured index satisfies the requirements. In order to ensure accuracy of the measurement, the measurement needs to be performed in an anechoic chamber, so as to eliminate noise interference from an external environment. The white paper issued by the CTIA states an extremely strict requirement for the measurement environment in the anechoic chamber. Interference caused by reflections of signals inside the anechoic chamber needs to be controlled to a certain extent, ensuring the environment inside the anechoic chamber being clear, having no reflected electromagnetic waves and being similar to an infinite vacuum, thereby ensuring the accuracy of the performance measurement of the wireless terminal.

According to a measurement provision of the CTIA, the wireless performance measurement needs to measure the performance values at the respective coordinate points of a whole spherical surface whose center is the measured piece. Taking a spherical coordinate system whose center is the measured piece as an example, the 3D wireless performance measurement of the wireless terminal requires that the wireless performance sampling measurement is performed with a step of at least 15° on θ axis and φ axis. In order to satisfy such 3D measurement requirements, there are several types of measurement systems in the related art as follows.

A first type of current measurement system is a single-antenna measurement system. A typical structure view is shown in FIGS. 1 and 2. FIG. 1 illustrates a single-antenna three-dimensional turntable system, a measured piece is placed at the axial center of a three-dimensional turntable, a measurement antenna is fixed, and the measured piece rotates about the θ axis and the φ axis via the three-dimensional turntable, achieving the wireless performance measurement of the whole spherical surface of the measured piece. FIG. 2 illustrates a single-antenna two-dimensional turntable system, the measured piece rotates around the φ axis via a two-dimensional turntable, the measurement antenna rotates about the θ axis via an annular rotating structure, such that the wireless performance measurement of the whole spherical surface of the measured piece is achieved by the combination of rotations of the turntable and the antenna. However such measurement systems have the following defects that: (1) a measuring speed is low and measuring time is long; (2) the three-dimensional turntable system in FIG. 1 and an antenna annular rotating structure in FIG. 2 will increase difficulty in design and construction of the anechoic chamber; (3) it is the most important that these mechanical devices placed inside the anechoic chamber will result in an increase of the reflection of electromagnetic waves inside the anechoic chamber, and the reflected electromagnetic waves are equal to noises for measurement, causing the microwave anechoic chamber to be not pure which is unable to simulate the infinite far vacuum environment with a ultra-low reflectivity, thereby causing the inaccuracy of the performance measurement of the wireless device.

A second type of current measurement system is a multiple-antenna measurement system. A typical structure is illustrated in FIG. 3a, two measurement antennas are arranged at positions where angles of θ are 15°, 30°, 45°, 60°, 75°, 90°, 105°, 120°, 135°, 150° and 165° correspondingly, relative positions are fixed among the antennas, the measured piece is placed on a two-dimensional turntable, and when the turntable rotates about the φ axis at a 180° angle, the 3D wireless performance index of the measured piece can be obtained. Or, as shown in FIG. 3b or 3c, one measurement antenna is arranged at positions where angles of θ are 15°, 30°, 45°, 60°, 75°, 90°, 105°, 120°, 135°, 150° and 165° correspondingly, the measured piece is placed on the two-dimensional turntable, and when the turntable rotates about the φ axis at a 360° angle, the 3D wireless performance index of the measured piece can be obtained. These measurement systems have a high measuring speed and a shortened measuring time, but still have the defects that: (1) when a space of the anechoic chamber is not large enough, arranging multiple antennas in the same plane will result in a relatively small distance between the antennas, i.e., isolation between the antennas is not enough and coupling interference between the adjacent antennas will bring about a measurement error; (2) since the antenna for measurement itself is a signal emission source and is a conducting medium existing inside the anechoic chamber. When an antenna for measurement is emitting the measurement signal, the other antennas can be deemed as reflection sources. Therefore, in a system of multiple measurement antennas, there is a reflection source in a small angle range of the right front of any one measurement antenna, which will increase the reflection in the anechoic chamber, resulting in inaccuracy of the measurement as well.

SUMMARY

A main objective of the present disclosure is to overcome disadvantages in the related art, thus providing a multiple-antenna measurement system, which can greatly reduce noise interference between measurement antennas in the multiple-antenna measurement system of the related art, greatly improving measurement accuracy.

To achieve the above objective, a technical solution is provided by a first aspect of embodiments of the present disclosure.

A measurement system is provided and includes an anechoic chamber, a turntable, N measurement antennas, in which N is a natural number and N≥11, in which a spherical coordinate system is established by taking a center of a measured piece as an origin and coordinates of the i (i=1, 2, 3, . . . , N) measurement antenna is $A_i(\rho_i, \theta_i, \varphi_i)$, in which $\theta_i$ is a positive integral multiple of 15°, and at least one measurement antenna is arranged at a position where the angle $\theta$ is 15°, 30°, 45°, 60°, 75°, 90°, 105°, 120°, 135°, 150° or 165° correspondingly; and $0 \leq \varphi_i \leq 360°$, and the N measurement antennas are not located in the same plane.

Furthermore, in an embodiment of the present disclosure, in included angles defined by any two measurement antennas and the origin, an included angle $\alpha$ whose vertex is the origin is within a range that $15° \leq \alpha < \mathbf{180°}$.

Furthermore, in an embodiment of the present disclosure, the included angle $\alpha$ is within a range that $15° \leq \alpha \leq \mathbf{165°}$.

Furthermore, in an embodiment of the present disclosure, the included angle $\alpha$ is within a range that $30° \leq \alpha \leq 150°$.

Furthermore, in an embodiment of the present disclosure, the N=11.

Furthermore, in an embodiment of the present disclosure, $\rho_i = \rho$ (i=1, 2, 3, . . . , N).

Furthermore, in an embodiment of the present disclosure, the N measurement antennas are distributed in two planes.

Furthermore, in an embodiment of the present disclosure, the N measurement antennas are distributed in two planes perpendicular to each other.

Furthermore, in an embodiment of the present disclosure, the N measurement antennas are distributed in three planes.

Furthermore, in an embodiment of the present disclosure, the coordinates of the eleven measurement antennas respectively is $A_1(\rho, 15°, 0°)$, $A_2(\rho, 30°, 90°)$, $A_3(\rho, 45°, 0°)$, $A_4(\rho, 60°, 90°)$, $A_5(\rho, 75°, 180°)$, $A_6(\rho, 90°, 90°)$, $A_7(\rho, 105°, 180°)$, $A_8(\rho, 120°, 90°)$, $A_9(\rho, 135°, 0°)$, $A_{10}(\rho, 150°, 90°)$, and $A_{11}(\rho, 165°, 0°)$.

Furthermore, in an embodiment of the present disclosure, the coordinates of the eleven measurement antennas respectively is $A_1(\rho, 15°, 0°)$, $A_2(\rho, 30°, 90°)$, $A_3(\rho, 45°, 0°)$, $A_4(\rho, 60°, 90°)$, $A_5(\rho, 75°, 0°)$, $A_6(\rho, 90°, 90°)$, $A_7(\rho, 105°, 0°)$, $A_8(\rho, 120°, 90°)$, $A_9(\rho, 135°, 0°)$, $A_{10}(\rho, 150°, 90°)$, and $A_{11}(\rho, 165°, 0°)$.

Furthermore, in an embodiment of the present disclosure, the coordinates of the eleven measurement antennas respectively is $A_1(\rho, 15°, 90°)$, $A_2(\rho, 30°, 270°)$, $A_3(\rho, 45°, 180°)$, $A_4(\rho, 60°, 90°)$, $A_5(\rho, 75°, 0°)$, $A_6(\rho, 90°, 270°)$, $A_7(\rho, 105°, 90°)$, $A_8(\rho, 120°, 180°)$, $A_9(\rho, 135°, 270°)$, $A_{10}(\rho, 150°, 0°)$, and $A_{11}(\rho, 165°, 180°)$.

Furthermore, in an embodiment of the present disclosure, the coordinates of the eleven measurement antennas respectively is $A_1(\rho, 15°, 90°)$, $A_2(\rho, 30°, 0°)$, $A_3(\rho, 45°, 0°)$, $A_4(\rho, 60°, 0°)$, $A_5(\rho, 75°, 90°)$, $A_6(\rho, 90°, 90°)$, $A_7(\rho, 105°, 90°)$, $A_8(\rho, 120°, 0°)$, $A_9(\rho, 135°, 0°)$, $A_{10}(\rho, 150°, 0°)$, and $A_{11}(\rho, 165°, 90°)$.

Furthermore, in an embodiment of the present disclosure, the coordinates of the eleven measurement antennas respectively is $A_1(\rho, 15°, 210°)$, $A_2(\rho, 30°, 330°)$, $A_3(\rho, 45°, 90°)$, $A_4(\rho, 60°, 210°)$, $A_5(\rho, 75°, 330°)$, $A_6(\rho, 90°, 90°)$, $A_7(\rho, 105°, 210°)$, $A_8(\rho, 120°, 330°)$, $A_9(\rho, 135°, 90°)$, $A_{10}(\rho, 150°, 330°)$, and $A_{11}(\rho, 165°, 210°)$.

In the multiple-antenna measurement system of the related art, the measurement antennas are located in the same plane, i.e., $\varphi$ is 0° or 180°. In the present disclosure, the measurement antennas are arranged in a plurality of planes ($0 \leq \varphi_i \leq 360°$), and the N measurement antennas are not located in the same plane), thus improving isolation between the measurement antennas, reducing interference noises between the measurement antennas, improving measurement accuracy. Specifically, the smaller the included angle $\alpha$ is, the closer the two measurement antennas are, and the smaller the isolation is, while the larger the $\alpha$ is, the stronger the reflection between the two measurement antennas is.

Therefore, as for the measurement system whose requirements for the isolation between the measurement antennas are not high, a lower limit value of the included angle $\alpha$ can be reduced, for example, let $15° \leq \alpha$, that is, any one measurement antenna is relatively close to an adjacent measurement antenna. If the requirements for the isolation between the measurement antennas are relatively high, the lower limit value of the included angle $\alpha$ can be increased, for example, let $30° \leq \alpha$, that is, any one measurement antenna is relatively far from an adjacent measurement antenna. On the other hand, as for the measurement system whose reflection between the measurement antennas is not strong, an upper limit value of the included angle $\alpha$ can be increased, for example, let $\alpha \leq 165°$, or let $\alpha < 180°$, it should be noted that the included angle $\alpha$ should be avoided from equaling to 180° (that is, the two antennas are right opposite, in which case the reflection energy is strongest, making a relatively great influence on the measurement). If the reflection between the measurement antennas is relatively strong, the upper limit value of the included angle $\alpha$ can be reduced, for example, let $\alpha \leq 150°$, that is, there is no antenna in a range of a relatively large angle right in front of the antenna. Therefore, with the above technical solutions of the present disclosure, a measurement environment with small coupling interference and low reflection between the measurement antennas can be provided in a relatively small anechoic chamber, improving the measurement accuracy.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Reference will be made in detail to embodiments of the present disclosure. The embodiments described herein with reference to drawings are explanatory, and used to generally understand the present disclosure. The embodiments shall not be construed to limit the present disclosure.

In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present invention, the term "a plurality of" means two or more than two, unless specified otherwise.

In the present invention, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present invention, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Figure 1:
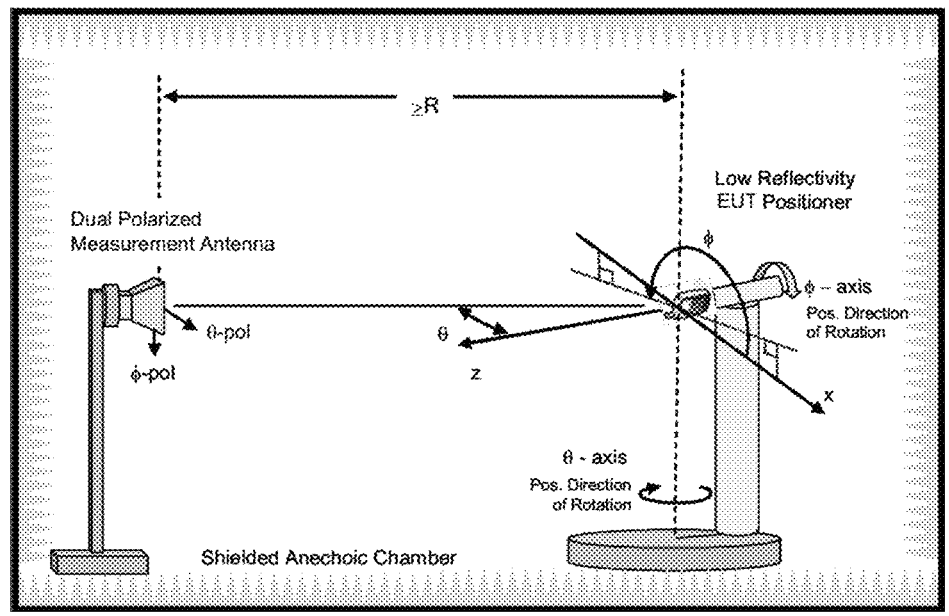
FIG. 1 is a schematic view of a typical single-antenna three-dimensional turntable system in the related art.
Figure 2:
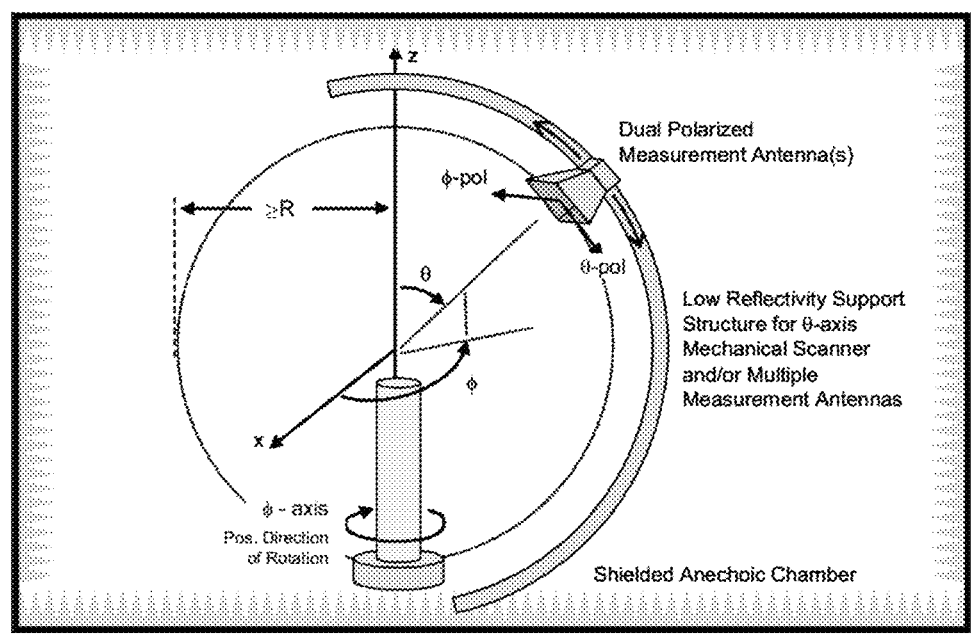
FIG. 2 is a schematic view of a typical single-antenna two-dimensional turntable system in the related art.
Figure 3A:
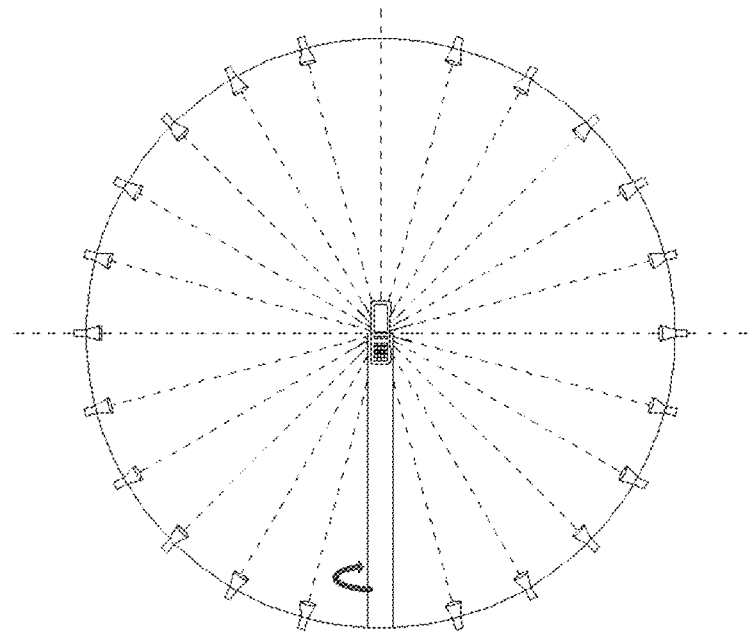
FIG. 3a is a schematic view of a typical multiple-antenna two-dimensional turntable system in the related art.
Figure 3B:
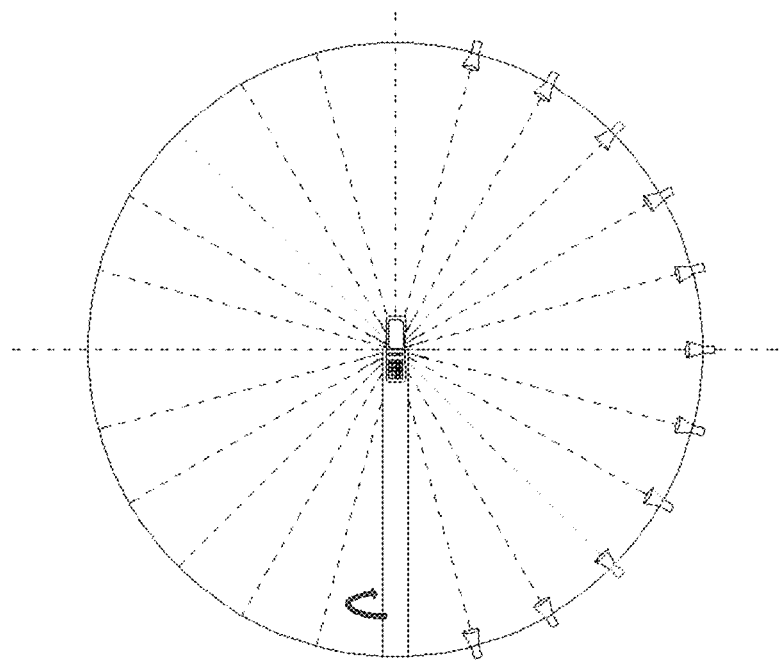
FIG. 3b is a schematic view of another typical multiple-antenna two-dimensional turntable system in the related art.
Figure 3C:
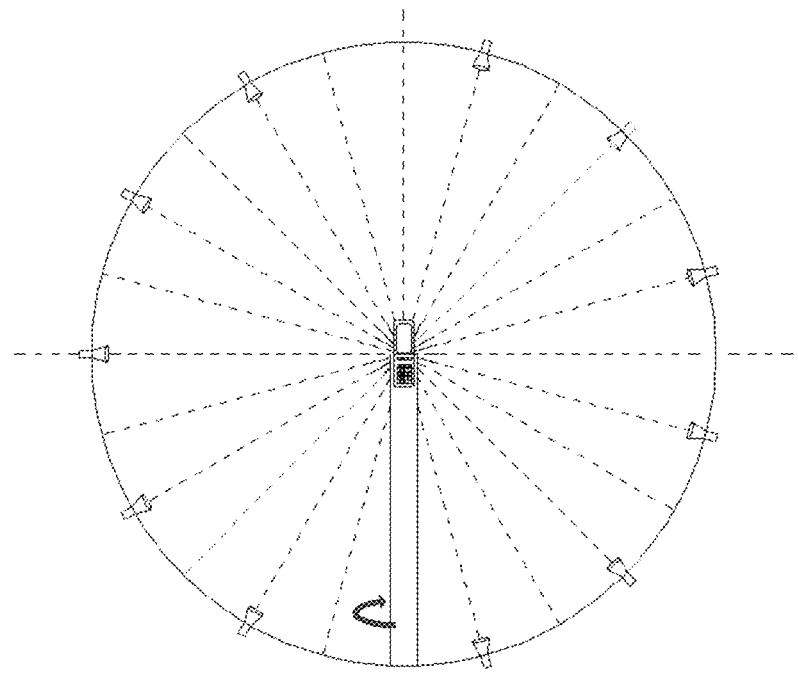
FIG. 3c is a schematic view of still another typical multiple-antenna two-dimensional turntable system in the related art.
Figure 4:
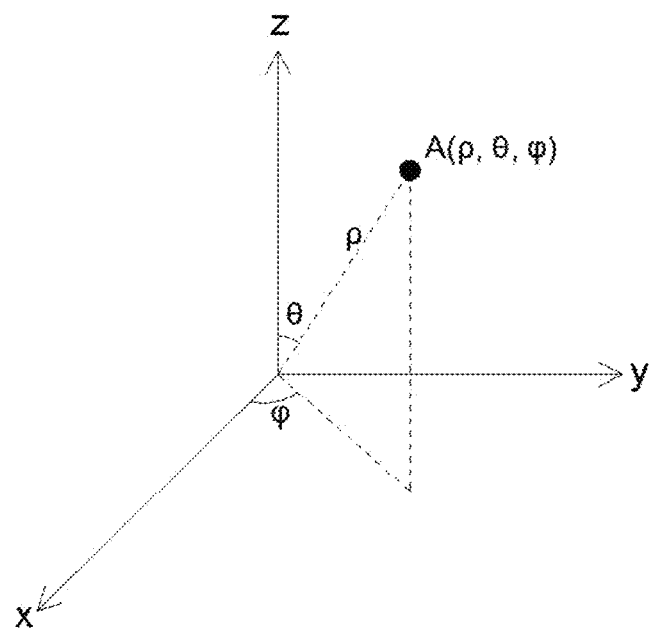
FIG. 4 is a schematic view of a spherical coordinate system established by taking a center of a measured piece as an origin.

A measurement system of the present disclosure includes an anechoic chamber, a turntable, N measurement antennas (N is a natural number and N≥11). According to requirements of the Cellular Telecommunications and Internet Association (CTIA), wireless performance sampling measurement is performed with a step of at least 15° on θ axis and φ axis. Rotation of the φ axis depends on the turntable, and the turntable can satisfy the sampling with the step of 15° or less on the φ axis. For example, sampling points on the φ axis can include at least φ=0°, φ=15°, φ=30°, φ=45°, φ=60°, φ=75°, φ=90°, φ=105°, φ=120°, φ=135°, φ=150°, φ=165°, φ=180°, φ=195°, φ=210°, φ=225°, φ=240°, φ=255°, φ=270°, φ=285°, φ=300°, φ=315°, φ=330° and φ=345°, in total of 24 sampling angles. The sampling points with the step of 15° on the θ axis rely on a plurality of measurement antennas to complete. According to the requirements of CTIA, positions where θ=0° and θ=180° are not measured. Therefore, sampling points on the θ axis include θ=15°, θ=30°, θ=45°, θ=60°, θ=75°, θ=90°, θ=105°, θ=120°, θ=135°, θ=150° and θ=165°, in total of 11 sampling points. At least one measurement antenna is needed at each θ sampling angle. Referring to FIG. 4, a spherical coordinate system is established by taking a center of a measured piece as an origin, the coordinates of any one point are A(ρ, θ, φ), in which, x=ρ sin θ cos φ, y=ρ sin θ sin φ, z=ρ cos θ. Coordinates of the i (i=1, 2, 3, ..., N) measurement antenna is $A_i(ρ_i, θ_i, φ_i)$, $θ_i$ is a positive integral multiple of 15°, and at least one measurement antenna is arranged at a position where the angle θ is 15°, 30°, 45°, 60°, 75°, 90°, 105°, 120°, 135°, 150° or 165° correspondingly. Thus when N equals to 11, the 11 measurement antennas are just located at positions of the above angles of θ correspondingly. The measurement antenna still needs to satisfy $0≤φ_i≤360°$, and the N measurement antennas are not located in the same plane.

In the present disclosure, the measurement antennas are distributed in a three-dimensional space whose center is the measured piece ($0≤φ_i≤360°$), and the N measurement antennas are not located in the same plane, i.e., the measurement antennas are distributed in a plurality of planes. Such design can improve isolation between the measurement antennas, reduce interference noises between the measurement antennas, and improve measurement accuracy. Specifically, in included angles defined by any two measurement antennas and the origin, the included angle whose vertex is the origin is denoted by α, the isolation between the measurement antennas can be controlled by varying α, thereby controlling the interference noises between the measurement antennas. The smaller the included angle α is, the closer the two measurement antennas are, and the smaller the isolation is. The larger the α is, the stronger the reflection between the two measurement antennas is. Therefore, as for a measurement system whose requirements for isolation between measurement antennas are not high, a lower limit value of the included angle α can be reduced, for example, let 15°≤α, that is, any one measurement antenna is relatively close to an adjacent measurement antenna. If the requirements for the isolation between measurement antennas are relatively high, the lower limit value of the included angle α can be increased, for example, let 30°≤α, that is, any one measurement antenna is relatively far from the adjacent measurement antenna. On the other hand, as for a measurement system whose reflection between the measurement antennas is not strong, an upper limit value of the included angle α can be increased, for example, let α≤165°, or let α<180°, it should be noted that the included angle α should be avoided from equaling to 180° (that is, the two antennas are right opposite, in which case the reflection energy is strongest, making a relatively great influence on measurement). If the reflection between the measurement antennas is relatively strong, the upper limit value of the included angle α can be reduced, for example, let α≤150°, that is, there is no antenna in a range of a relatively large angle right in front of the antenna. Therefore, with the above technical solutions of the present disclosure, a measurement environment with small coupling interference and low reflection between the measurement antennas can be provided in a relatively small anechoic chamber, improving the measurement accuracy. The present disclosure divides the included angles α into three levels: ① 15°≤α≤180°; ② 15°≤α≤165°; ③ 30°≤α≤150°. According to the above description, as for the measurement system with low requirements for isolation and low reflection between the measurement antennas, the isolation level that 15°≤α<180° can be adopted. As for the measurement system with high requirements for isolation and high reflection between the measurement antennas, the isolation level that 15°≤α≤165°, or even 30°≤α≤150° can be adopted. With the isolation level that 30°≤α≤150°, the coupling and reflection interference between the measurement antennas can be significantly reduced to a relatively low level, thus greatly improving the measurement accuracy. The included angle α can be adjusted according to actual situations of different measurement systems, and is not limited to the above three specific ranges, for example, it can satisfy that 15°≤α≤150°, or 30°≤α≤165°, or 30°≤α<180°, and so on. In addition, given the engineer design difficulty and construction cost of the measurement system, the included angle α a in the embodiments listed in the present disclosure is a positive integral multiple of 15°. The protection scope of the present disclosure is not limited to this, for example, the included angle α can satisfy that 17°≤α<170°, or 35°≤α≤155°, or 22°≤α≤160°, and so on. All should be deemed as within the protection scope of the present disclosure as long as 15°≤α<180°.

In embodiments 1-5 of the present disclosure, eleven dual polarized measurement antennas are adopted to correspond eleven sampling angles, that is, each sampling angle θ corresponds to one dual polarized measurement antenna. And distance between each measurement antenna and the center (i.e., a measuring center of the anechoic chamber) of the measured piece is equal, that is, $\rho_1 = \rho_2 = \rho_3 = \ldots \rho_{11} = \rho$. The distribution of the measurement antennas in respective embodiments will be described in detail below.

Figure 5A:
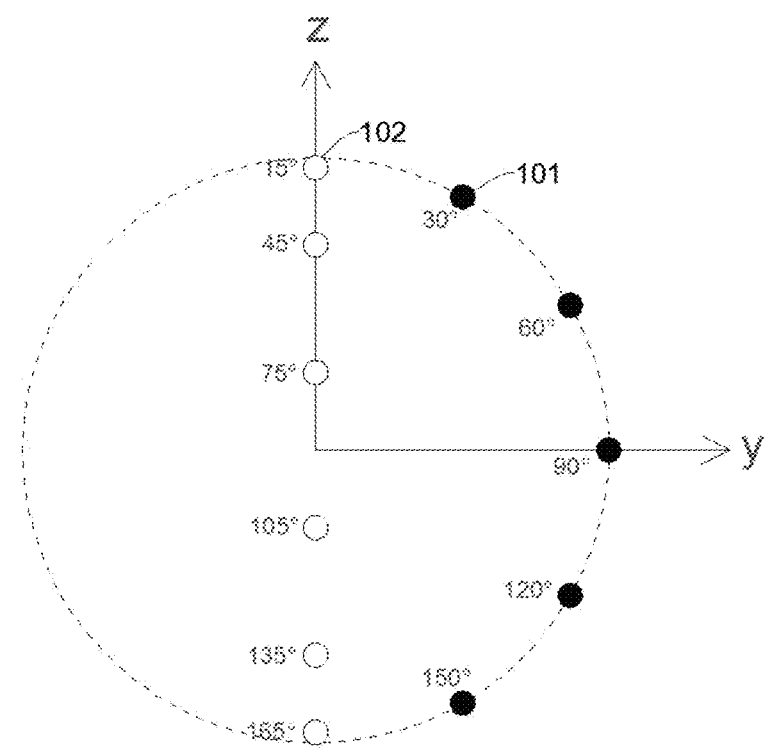
FIG. 5a is a front view of a measurement antenna of embodiment 1 in a spherical coordinate system.
Figure 5B:
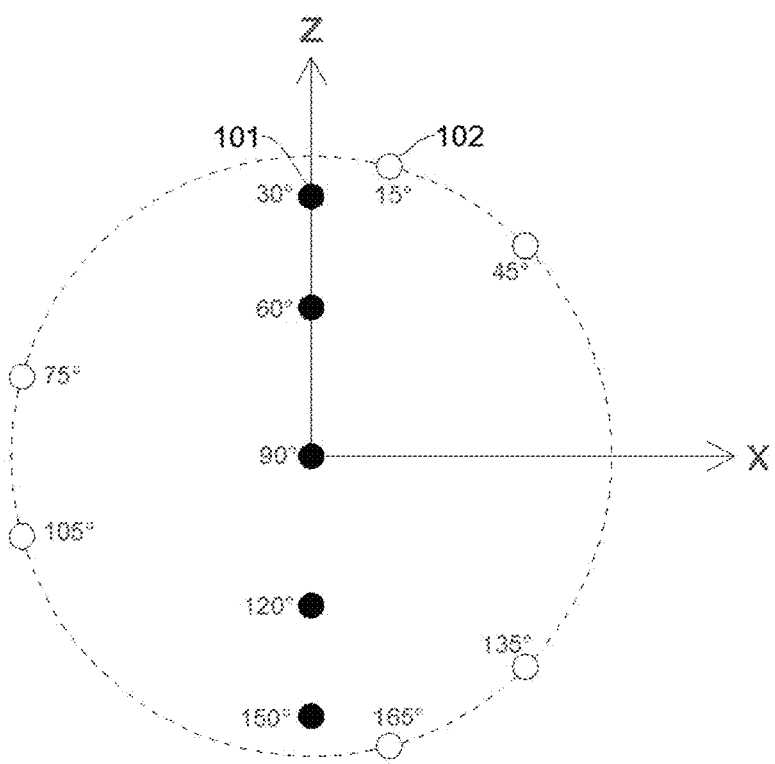
FIG. 5b is a left view of the measurement antenna of embodiment 1 in the spherical coordinate system.
Figure 5C:
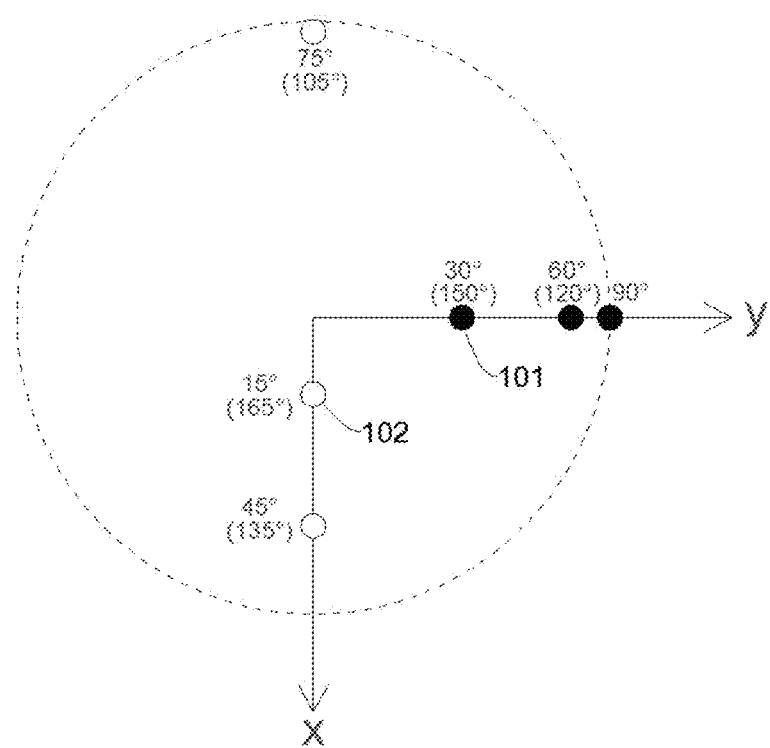
FIG. 5c is a top view of the measurement antenna of embodiment 1 in the spherical coordinate system.

The distribution of the measurement antennas in embodiment 1 is illustrated in FIGS. 5a, 5b and 5c, eleven measurement antennas are distributed in two planes perpendicular to each other, in which, five measurement antennas 101 are distributed in one plane, and six measurement antennas 102 are distributed in the other plane. Coordinates of the eleven measurement antennas respectively are $A_1(\rho, 15°, 0°)$, $A_2(\rho, 30°, 90°)$, $A_3(\rho, 45°, 0°)$, $A_4(\rho, 60°, 90°)$, $A_5(\rho, 75°, 180°)$, $A_6(\rho, 90°, 90°)$, $A_7(\rho, 105°, 180°)$, $A_8(\rho, 120°, 90°)$, $A_9(\rho, 135°, 0°)$, $A_{10}(\rho, 150°, 90°)$, and $A_{11}(\rho, 165°, 0°)$. In included angles defined by any two measurement antennas and the origin, the included angle α whose vertex is the origin is within a range: 30°≤α≤150°.

Figure 6A:
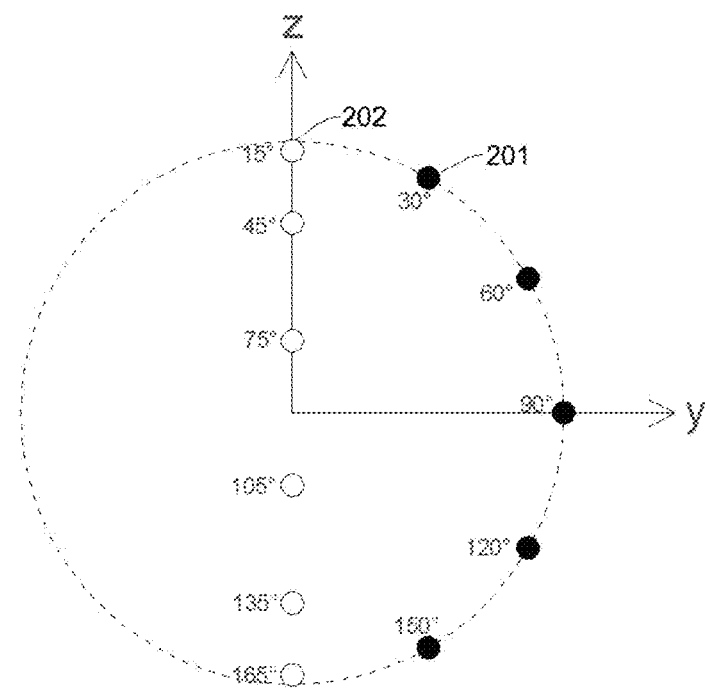
FIG. 6a is a front view of a measurement antenna of embodiment 2 in a spherical coordinate system.
Figure 6B:
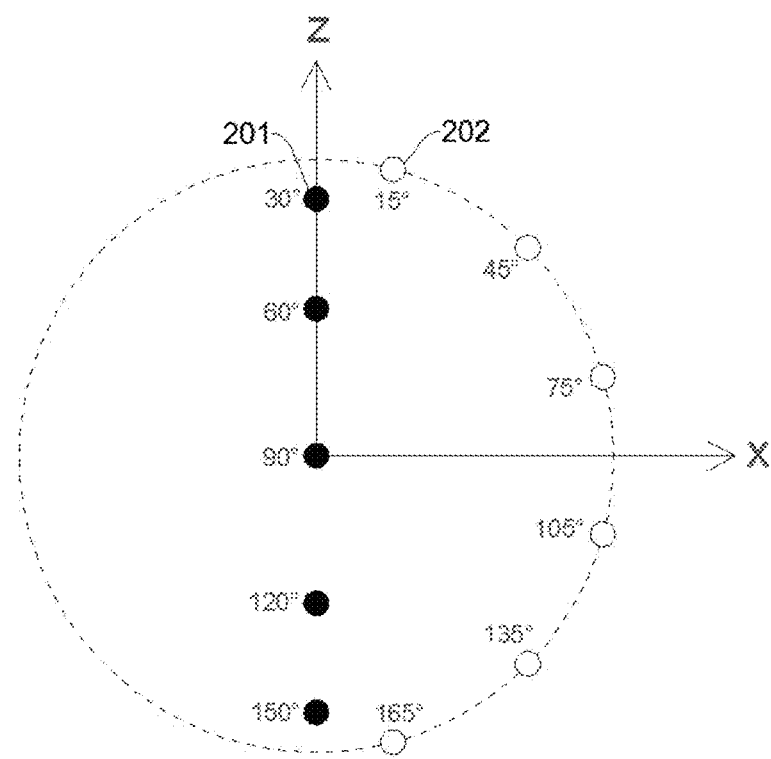
FIG. 6b is a left view of the measurement antenna of embodiment 2 in the spherical coordinate system.
Figure 6C:
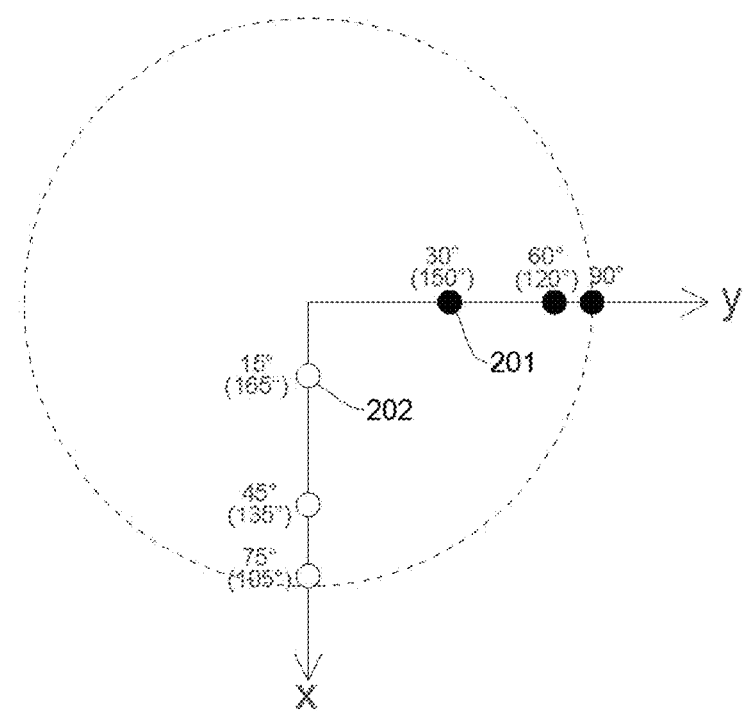
FIG. 6c is a top view of the measurement antenna of embodiment 2 in the spherical coordinate system.

The distribution of the measurement antennas in embodiment 2 is illustrated in FIGS. 6a, 6b and 6c, eleven measurement antennas are distributed in two planes perpendicular to each other, in which, five measurement antennas 201 are distributed in one plane, six measurement antennas 202 are distributed in the other plane. Coordinates of the eleven measurement antennas are $A_1(\rho, 15°, 0°)$, $A_2(\rho, 30°, 90°)$, $A_3(\rho, 45°, 0°)$, $A_4(\rho, 60°, 90°)$, $A_5(\rho, 75°, 0°)$, $A_6(\rho, 90°, 90°)$, $A_7(\rho, 105°, 0°)$, $A_8(\rho, 120°, 90°)$, $A_9(\rho, 135°, 0°)$, $A_{10}(\rho, 150°, 90°)$, and $A_{11}(\rho, 165°, 0°)$. In included angles defined by any two measurement antennas and the origin, the included angle α whose vertex is the origin is within a range: 30°≤α≤150°.

Figure 7A:
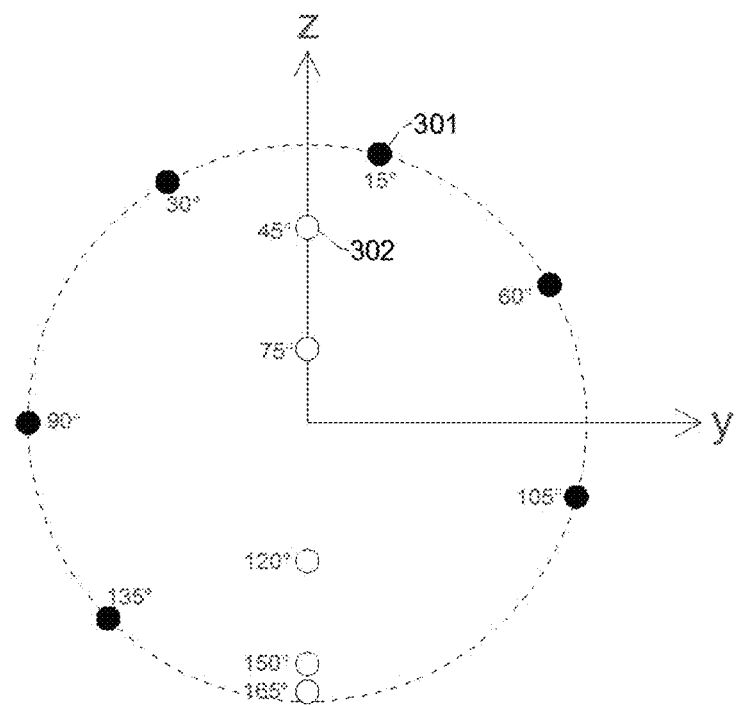
FIG. 7a is a front view of a measurement antenna of embodiment 3 in a spherical coordinate system.
Figure 7B:
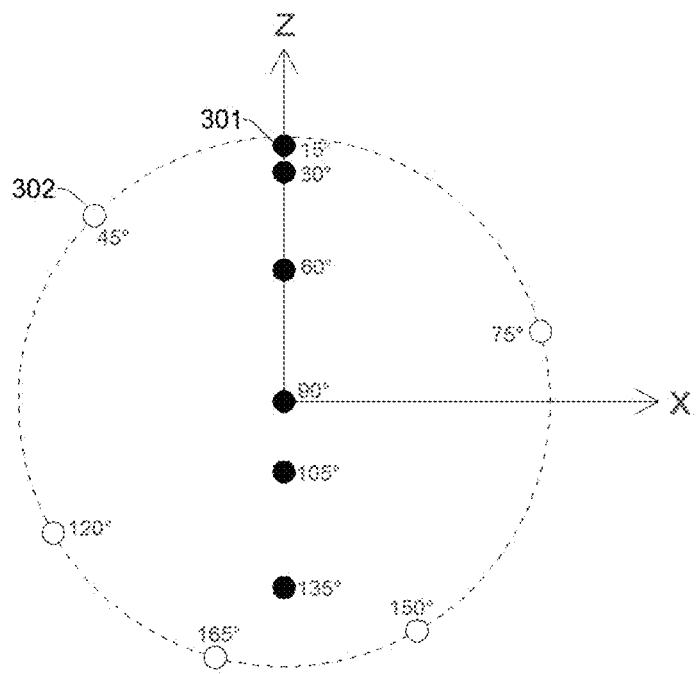
FIG. 7b is a left view of the measurement antenna of embodiment 3 in the spherical coordinate system.
Figure 7C:
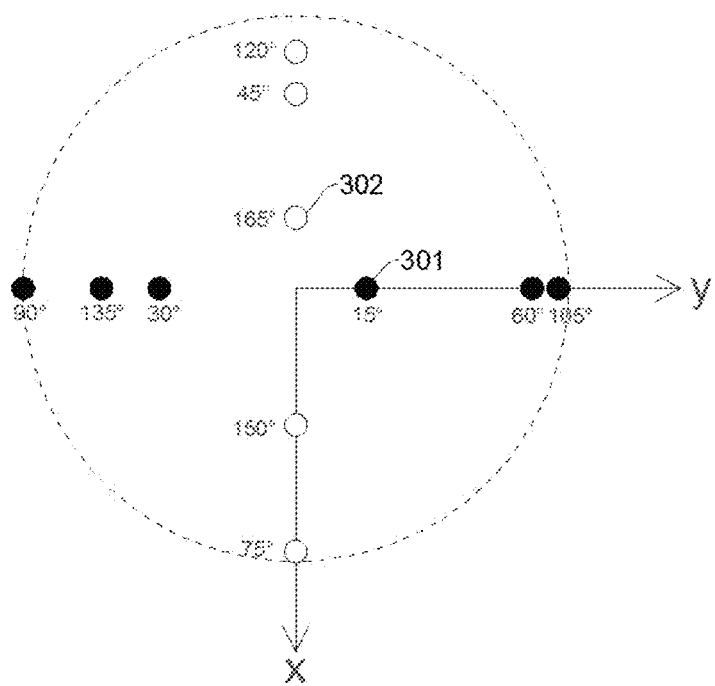
FIG. 7c is a top view of the measurement antenna of embodiment 3 in the spherical coordinate system.

The distribution of the measurement antennas in embodiment 3 is illustrated in FIGS. 7a, 7b and 7c, eleven measurement antennas are distributed in two planes perpendicular to each other, in which, six measurement antennas 301 are distributed in one plane, and five measurement antennas 302 are distributed in the other plane. Coordinates of the eleven measurement antennas are respectively $A_1(\rho, 15°, 90°)$, $A_2(\rho, 30°, 270°)$, $A_3(\rho, 45°, 180°)$, $A_4(\rho, 60°, 90°)$, $A_5(\rho, 75°, 0°)$, $A_6(\rho, 90°, 270°)$, $A_7(\rho, 105°, 90°)$, $A_8(\rho, 120°, 180°)$, $A_9(\rho, 135°, 270°)$, $A_{10}(\rho, 150°, 0°)$, and $A_{11}(\rho, 165°, 180°)$. In an included angle defined by any two measurement antennas and the origin, the included angle α whose vertex is the origin is within a range: 30°≤α≤165°.

Figure 8A:
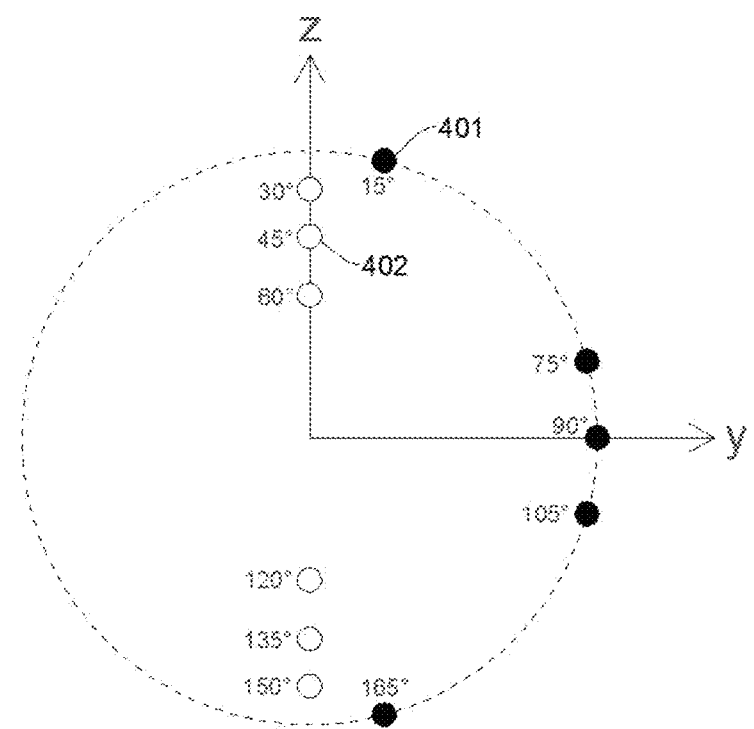
FIG. 8a is a front view of a measurement antenna of embodiment 4 in a spherical coordinate system.
Figure 8B:
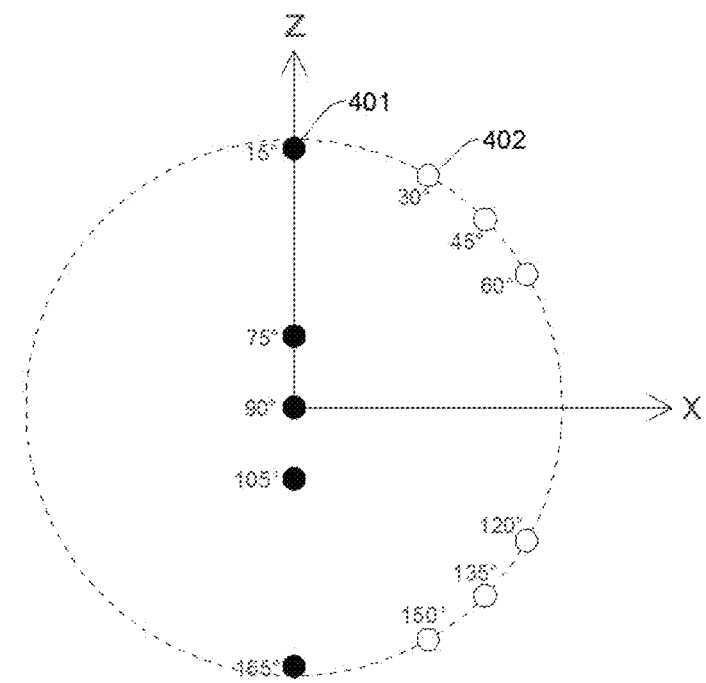
FIG. 8b is a left view of the measurement antenna of embodiment 4 in the spherical coordinate system.
Figure 8C:
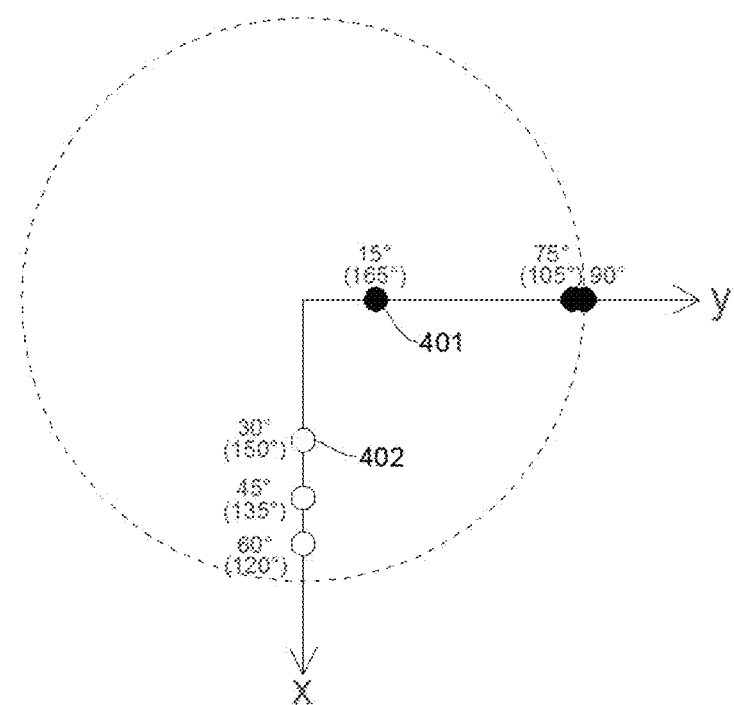
FIG. 8c is a top view of the measurement antenna of embodiment 4 in the spherical coordinate system.

The distribution of the measurement antennas in embodiment 4 is illustrated in FIGS. 8a, 8b and 8c, eleven measurement antennas are distributed in two planes perpendicular to each other, in which, five measurement antennas 401 are distributed in one plane, and six measurement antennas 402 are distributed in the other plane. Coordinates of the eleven measurement antennas are $A_1(\rho, 15°, 90°)$, $A_2(\rho, 30°, 0°)$, $A_3(\rho, 45°, 0°)$, $A_4(\rho, 60°, 0°)$, $A_5(\rho, 75°, 90°)$, $A_6(\rho, 90°, 90°)$, $A_7(\rho, 105°, 90°)$, $A_8(\rho, 120°, 0°)$, $A_9(\rho, 135°, 0°)$, $A_{10}(\rho, 150°, 0°)$, and $A_{11}(\rho, 165°, 90°)$. In an included angle defined by any two measurement antennas and the origin, the included angle α whose vertex is the origin is within a range: 15°≤α≤150°.

Figure 9A:
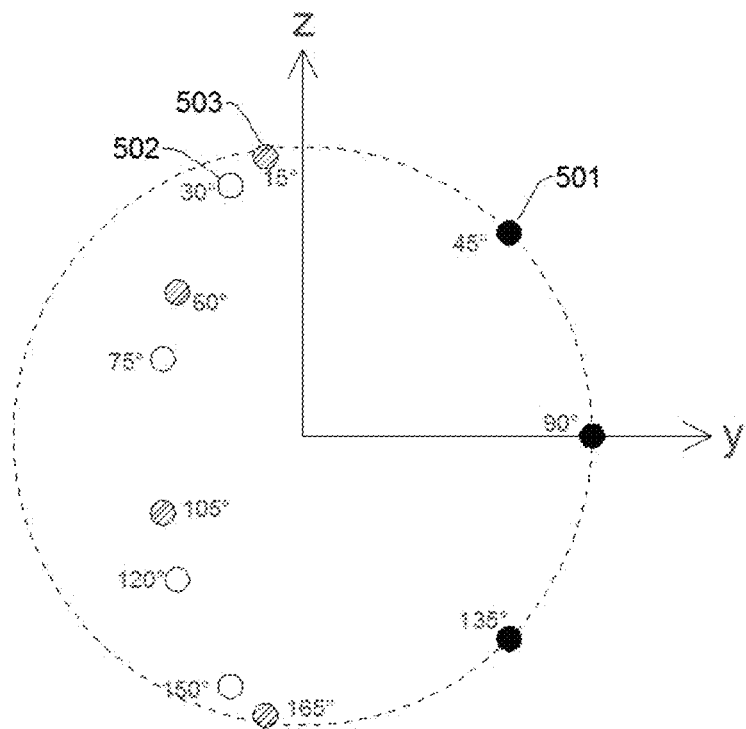
FIG. 9a is a front view of a measurement antenna of embodiment 5 in a spherical coordinate system.
Figure 9B:
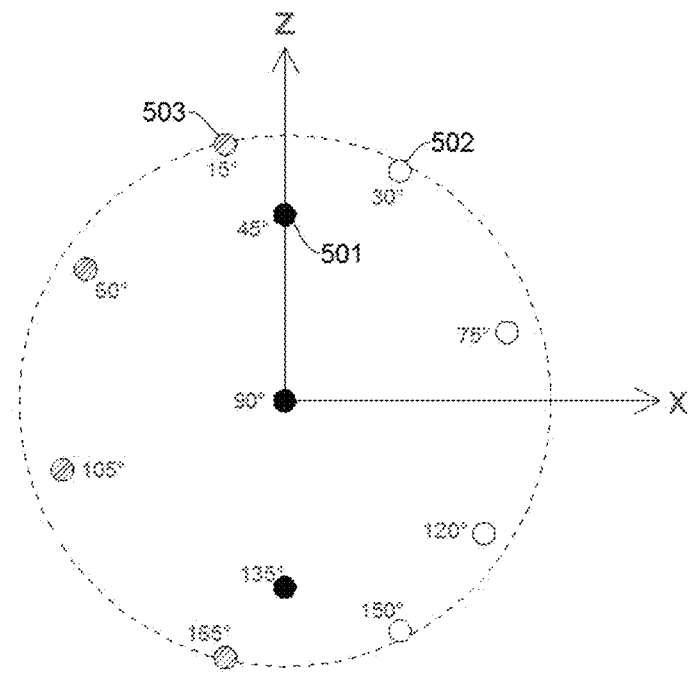
FIG. 9b is a left view of the measurement antenna of embodiment 5 in the spherical coordinate system.
Figure 9C:
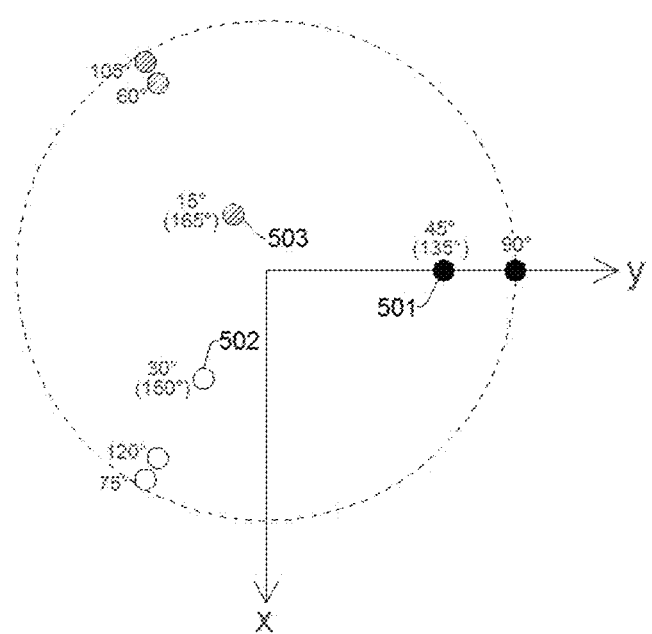
FIG. 9c is a top view of the measurement antenna of embodiment 5 in the spherical coordinate system.

The distribution of the measurement antennas in embodiment 5 is illustrated in FIGS. 9a, 9b and 9c, eleven measurement antennas are distributed in three planes, an included angle between any two planes is 60°/120°, in which, three measurement antennas 501 are distributed in a first plane, four measurement antennas 502 are distributed in a second plane, and four measurement antennas 503 are distributed in a third plane. Coordinates of the eleven measurement antennas are $A_1(\rho, 15°, 210°)$, $A_2(\rho, 30°, 330°)$, $A_3(\rho, 45°, 90°)$, $A_4(\rho, 60°, 210°)$, $A_5(\rho, 75°, 330°)$, $A_6(\rho, 90°, 90°)$, $A_7(\rho, 105°, 210°)$, $A_8(\rho, 120°, 330°)$, $A_9(\rho, 135°, 90°)$, $A_{10}(\rho, 150°, 330°)$, and $A_{11}(\rho, 165°, 210°)$. In an included angle defined by any two measurement antennas and the origin, the included angle α whose vertex is the origin is within a range: 30°≤α≤150°.

Figure 10:
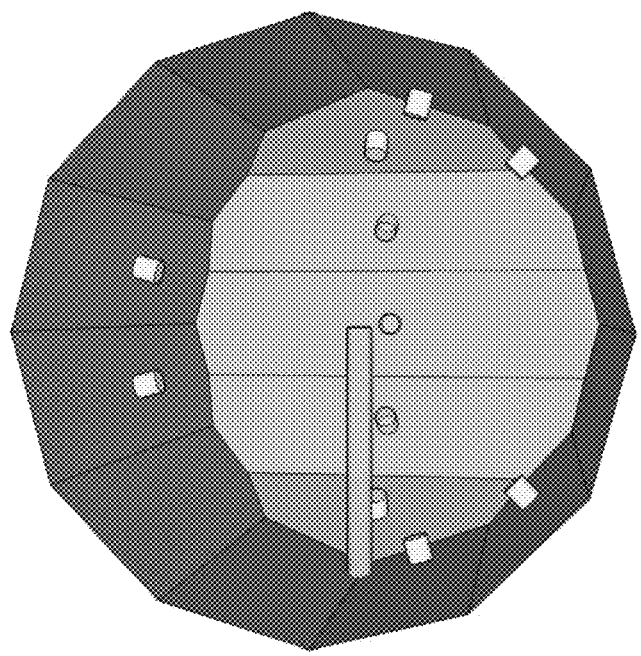
FIG. 10 is a stereoscopic sectional view of a specific embodiment of a measurement system of embodiment 1, in which in order to clearly illustrate a turntable and measurement antennas inside an anechoic chamber, wave-absorbing material is not shown in FIG. 10.
Figure 11:
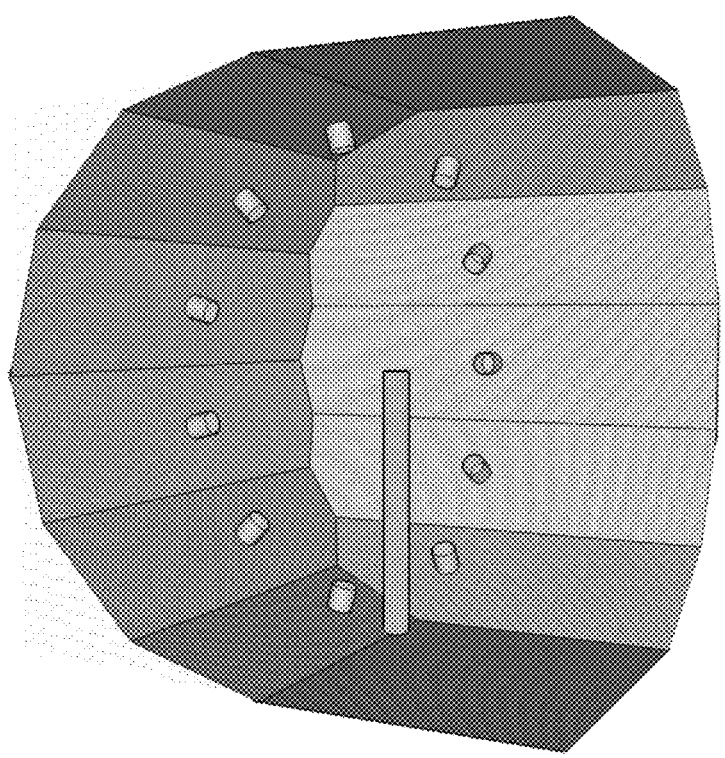
FIG. 11 is a stereoscopic sectional view of a specific embodiment of a measurement system of embodiment 2, in which in order to clearly illustrate a turntable and measurement antennas inside an anechoic chamber, wave-absorbing materials are not shown in FIG. 11.

In the above embodiments 1-5, $\rho_1 = \rho_2 = \rho_3 = \ldots \rho_{11} = \rho$, that is, the distance between each measurement antenna and the center (i.e., a measuring center of the anechoic chamber) of the measured piece is equal, therefore all the measurement antennas are located on a spherical surface with a radius ρ. During construction of the measurement system, the measurement antennas can be mounted to an annular or polygonal antenna support inside the anechoic chamber. Or, by another way, a shielding shell of the anechoic chamber can be designed as a sphere, a cylinder or a polygon, and the measurement antennas are directly mounted to the shielding shell of the anechoic chamber, avoiding using the antenna support structure which could produce interference on the measurement. FIG. 10 illustrates a specific embodiment of the measurement system of embodiment 1, the shielding shell of the anechoic chamber is constituted by one complete regular dodecagonal structure and one partial regular dodecagonal structure. Since a central angle of a regular dodecagon is 30°, the angles θ and φ which are positive integral multiples of 15° can be easily positioned by vertexes of the regular dodecagon and middle points of the respective sides. As illustrated in FIG. 10, six measurement antennas are mounted to the complete regular dodecagonal structure, five measurement antennas are mounted to the partial regular dodecagonal structure, wave-absorbing materials (not shown in FIG. 10) may also be mounted inside the shielding shell (i.e., interior of the regular dodecagonal structure). The measurement antennas are easy to be mounted and need no additionally antenna support structure, greatly reducing the construction difficulty and cost of the anechoic chamber. In addition, the structures in the anechoic chamber are symmetrical and aesthetic. FIG. 11 illustrates a specific embodiment of the measurement system of embodiment 2, the shielding shell of the anechoic chamber is constituted by two partial regular dodecagonal structures, the measurement antennas are mounted on surfaces of the regular dodecagonal structures at corresponding angles, in which, six measurement antennas are mounted to one partial regular dodecagonal structure, and five measurement antennas re mounted to the other partial regular dodecagonal structure, wave-absorbing materials can also be mounted inside the shielding shell (i.e., interior of the regular dodecagonal structure), the measurement system is simple and aesthetic as well.

If $\rho_i$ values of the respective measurement antennas are not equal, i.e., distances between the measurement antennas and the center (i.e., a measuring center of the anechoic chamber) of the measured piece are not equal, the respective $\rho_i$ values can be designed according to the difficulty and cost of the construction of the system, for example, the respective measurement antennas can be located on surfaces of a virtual cube or rectangular cuboid whose center is the center of the measured piece.

The above contents are further descriptions of the present disclosure made with reference to specific/preferable embodiments, and embodiments of the present disclosure should not be limited to these descriptions. To those skilled in the art, in the premise of without conceptions of the present disclosure, alternatives and modifications can be made in these described embodiments, and all these alternatives and modifications should be deemed as within the protection scope of the present disclosure.

What is claimed is:

1. A measurement system comprising an anechoic chamber, a turntable, N measurement antennas, in which N is a natural number and N≥11, wherein a spherical coordinate system is established by taking a center of a measured piece as an origin and coordinates of the i (i=1, 2, 3, . . . , N) measurement antenna is $A_i(\rho_i, \theta_i, \varphi_i)$, wherein $\theta_i$ is a positive integral multiple of 15°, and at least one measurement antenna is arranged at a position where angle θ is 15°, 30°, 45°, 60°, 75°, 90°, 105°, 120°, 135°, 150° or 165° correspondingly; and 0≤$\varphi_i$≤360°, and the N measurement antennas are not located in the same plane, wherein in included angles defined by any two measurement antennas and the origin, an included angle α whose vertex is the origin is within a range that 15°≤α<180°;

wherein a shielding shell of the anechoic chamber is constituted by a partial regular dodecagonal structure and/or a complete regular dodecagonal structure, and each measurement antenna is located at a vertex or a middle point of a respective side of the regular dodecagon.

2. The measurement system according to claim 1, wherein the included angle α is within a range that 15°≤α≤165°.

3. The measurement system according to claim 2, wherein the included angle α is within a range that 30°≤α≤150°.

4. The measurement system according to claim 1, wherein the N=11.

5. The measurement system according to claim 1, wherein $\rho_i$=ρ (i=1, 2, 3, . . . , N).

6. The measurement system according to claim 1, wherein the N measurement antennas are distributed in two planes.

7. The measurement system according to claim 1, wherein the N measurement antennas are distributed in two planes perpendicular to each other.

8. The measurement system according to claim 1, wherein the N measurement antennas are distributed in three planes.

9. The measurement system according to claim 1, wherein coordinates of the eleven measurement antennas are $A_1(\rho, 15°, 0°)$, $A_2(\rho, 30°, 90°)$, $A_3(\rho, 45°, 0°)$, $A_4(\rho, 60°, 90°)$, $A_5(\rho, 75°, 180°)$, $A_6(\rho, 90°, 90°)$, $A_7(\rho, 105°, 180°)$, $A_8(\rho, 120°, 90°)$, $A_9(\rho, 135°, 0°)$, $A_{10}(\rho, 150°, 90°)$, and $A_{11}(\rho, 165°, 0°)$.

10. The measurement system according to claim 1, wherein the coordinates of the eleven measurement antennas are $A_1(\rho, 15°, 0°)$, $A_2(\rho, 30°, 90°)$, $A_3(\rho, 45°, 0°)$, $A_4(\rho, 60°, 90°)$, $A_5(\rho, 75°, 0°)$, $A_6(\rho, 90°, 90°)$, $A_7(\rho, 105°, 0°)$, $A_8(\rho, 120°, 90°)$, $A_9(\rho, 135°, 0°)$, $A_{10}(\rho, 150°, 90°)$, and $A_{11}(\rho, 165°, 0°)$.

11. The measurement system according to claim 1, wherein the coordinates of the eleven measurement antennas are $A_1(\rho, 15°, 90°)$, $A_2(\rho, 30°, 270°)$, $A_3(\rho, 45°, 180°)$, $A_4(\rho, 60°, 90°)$, $A_5(\rho, 75°, 0°)$, $A_6(\rho, 90°, 270°)$, $A_7(\rho, 105°, 90°)$, $A_8(\rho, 120°, 180°)$, $A_9(\rho, 135°, 270°)$, $A_{10}(\rho, 150°, 0°)$, and $A_{11}(\rho, 165°, 180°)$.

12. The measurement system according to claim 1, wherein the coordinates of the eleven measurement antennas are $A_1(\rho, 15°, 90°)$, $A_2(\rho, 30°, 0°)$, $A_3(\rho, 45°, 0°)$, $A_4(\rho, 60°, 0°)$, $A_5(\rho, 75°, 90°)$, $A_6(\rho, 90°, 90°)$, $A_7(\rho, 105°, 90°)$, $A_8(\rho, 120°, 0°)$, $A_9(\rho, 135°, 0°)$, $A_{10}(\rho, 150°, 0°)$, and $A_{11}(\rho, 165°, 90°)$.

13. The measurement system according to claim 1, wherein the coordinates of the eleven measurement antennas are $A_1(\rho, 15°, 210°)$, $A_2(\rho, 30°, 330°)$, $A_3(\rho, 45°, 90°)$, $A_4(\rho, 60°, 210°)$, $A_5(\rho, 75°, 330°)$, $A_6(\rho, 90°, 90°)$, $A_7(\rho, 105°, 210°)$, $A_8(\rho, 120°, 330°)$, $A_9(\rho, 135°, 90°)$, $A_{10}(\rho, 150°, 330°)$, and $A_{11}(\rho, 165°, 210°)$.

14. The measurement system according to claim 1, wherein the N=11.

15. The measurement system according to claim 1, wherein ρi=ρ (i=1, 2, 3, . . . , N).

16. The measurement system according to claim 1, wherein the N measurement antennas are distributed in two planes.

17. The measurement system according to claim 1, wherein the N measurement antennas are distributed in two planes perpendicular to each other.

18. The measurement system according to claim 1, wherein the N measurement antennas are distributed in three planes.

* * * * *